United States Patent
Kittichungchit et al.

(10) Patent No.: US 9,553,278 B2
(45) Date of Patent: Jan. 24, 2017

(54) ORGANIC ELECTROLUMINSESCENCE ELEMENT AND LIGHTING DEVICE

(71) Applicant: PANASONIC INTELLECTUAL PROPERTY MANAGEMENT CO., LTD., Osaka (JP)

(72) Inventors: Varutt Kittichungchit, Osaka (JP); Kazuyuki Yamae, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/403,681

(22) PCT Filed: May 30, 2013

(86) PCT No.: PCT/JP2013/003412
§ 371 (c)(1),
(2) Date: Nov. 25, 2014

(87) PCT Pub. No.: WO2013/179668
PCT Pub. Date: Dec. 5, 2013

(65) Prior Publication Data
US 2015/0171360 A1 Jun. 18, 2015

(30) Foreign Application Priority Data
Jun. 1, 2012 (JP) ................. 2012-126468

(51) Int. Cl.
*H01L 51/54* (2006.01)
*H01L 51/50* (2006.01)
*H01L 51/52* (2006.01)

(52) U.S. Cl.
CPC ......... *H01L 51/5044* (2013.01); *H01L 51/504* (2013.01); *H01L 51/5278* (2013.01)

(58) Field of Classification Search
CPC . H01L 51/5044; H01L 51/5278; H01L 51/504
(Continued)

(56) References Cited

U.S. PATENT DOCUMENTS 6,337,492 B1 * 1/2002 Jones ............... H01L 27/3204
257/40
6,528,188 B1 3/2003 Suzuki et al.
(Continued)

FOREIGN PATENT DOCUMENTS

JP 3589960 8/2004
JP 2006-318777 11/2006
(Continued)

OTHER PUBLICATIONS

International Search Report (ISR) in International Patent Application No. PCT/JP2013/003412, dated Aug. 13, 2013.

*Primary Examiner* — Donald Raleigh
(74) *Attorney, Agent, or Firm* — Greenblum & Bernstein, P.L.C.

(57) ABSTRACT

The disclosure relates to an organic electroluminescence element including an organic layer including multiple light-emitting layers. The light-emitting layers include a blue light-emitting layer including a blue light-emitting dopant. In a case where emission color of the organic electroluminescence element operated at an operation temperature for a stable state is represented in a CIE1931 chromaticity coordinate system, when coordinate point A of the emission color at an early stage of use and coordinate point B of the emission color deteriorated by use are represented by $(x_1, y_1)$ and $(x_2, y_2)$ respectively, a relation of $y_2 \geq y_1$ is satisfied. When amounts of changes in x and y values from coordinate point A to coordinate point B are represented by equations of $\Delta x = x_2 - x_1$ and $\Delta y = y_2 - y_1$ respectively, a relation of $\Delta y \geq \Delta x$
(Continued)

is satisfied. It can be made difficult to perceive change in emission color and lifetime can be prolonged

14 Claims, 5 Drawing Sheets

(58) Field of Classification Search
USPC .......................................................... 313/504
See application file for complete search history.

(56) References Cited

U.S. PATENT DOCUMENTS

| | | | |
|---|---|---|---|
| 8,941,103 B2 | 1/2015 | Tsuji et al. | |
| 2006/0240278 A1* | 10/2006 | Hatwar | H01L 51/5278 428/690 |
| 2007/0090757 A1* | 4/2007 | Kim | H01L 27/3211 313/506 |
| 2009/0001882 A1 | 1/2009 | Park et al. | |
| 2009/0146552 A1 | 6/2009 | Spindler et al. | |
| 2009/0284140 A1* | 11/2009 | Osaka | C07C 211/54 313/504 |
| 2010/0123150 A1* | 5/2010 | Anandan | H01L 27/3209 257/98 |
| 2014/0008629 A1 | 1/2014 | Tsuji et al. | |
| 2014/0008631 A1* | 1/2014 | Tsuji | H01L 51/5044 257/40 |
| 2014/0009918 A1 | 1/2014 | Kubota et al. | |
| 2014/0016308 A1 | 1/2014 | Kubota et al. | |
| 2014/0022769 A1 | 1/2014 | Kubota et al. | |
| 2015/0029713 A1* | 1/2015 | Fieberg | H05B 33/0857 362/231 |

FOREIGN PATENT DOCUMENTS

| | | | | |
|---|---|---|---|---|
| JP | 2009-521095 | 5/2009 | | |
| JP | 2010-277878 | 12/2010 | | |
| JP | 2011-508368 | 3/2011 | | |
| JP | WO 2012128089 A1 * | 9/2012 | ......... | H01L 51/5044 |
| WO | 2007/073124 | 6/2007 | | |
| WO | 2009/075741 | 6/2009 | | |

* cited by examiner

ORGANIC ELECTROLUMINSESCENCE ELEMENT AND LIGHTING DEVICE

TECHNICAL FIELD

The present invention relates to organic electroluminescence elements and lighting devices.

BACKGROUND ART

In the past, there has been known an organic electroluminescence element (hereinafter referred to as "organic EL element" if needed) which includes a stack in which a light-emitting layer including a light-emitting dopant is between a pair of electrodes, and causes light emission by recombination of electrons and holes in the light-emitting layer.

CITATION LIST

Patent Literature

Patent Literature 1 JP 3589960 B2

SUMMARY OF INVENTION

Technical Problem

In the organic EL element, it is important that emission color is less likely to change with time. When the emission color changes, desired light emission cannot be obtained, and in some cases failure in light emission may occur. The emission color is one of properties of individual light to be perceived by a human depending on color and intensity of light, and can be converted in numerical values as chromaticity and luminance. In order to prolong lifetime of the organic EL element, it is considered to design the organic EL element so that chromaticity and luminance do not change with time as possible.

However, generally, the luminance of the organic EL element tends to deteriorate by use. In a case of using multiple light-emitting dopants, the light-emitting dopants have different deterioration speeds of luminance, and hence a color balance may be easily lost. Consequently, it is not easy to produce an organic EL element whose chromaticity and luminance are less likely to change.

Patent literature 1 discloses techniques of adjusting a light emission spectrum by use of two or more phosphors to reduce change with time in emission color. However, in the techniques disclosed in the literature, chromaticity can be adjusted, but there is no sufficient study to maintain luminance, and hence both changes in chromaticity and luminance are unlikely to be reduced sufficiently.

In view of the above insufficiency, the present invention has aimed to propose an organic electroluminescence element and a lighting device which are capable of suppressing change in emission color and have prolonged lifetime.

Solution to Problem

The organic electroluminescence element according to the present invention includes an organic layer including multiple light-emitting layers. The multiple light-emitting layers include a blue light-emitting layer including a blue light-emitting dopant. In a case where emission color of the organic electroluminescence element operated at an operation temperature for a stable state is represented in a CIE1931 chromaticity coordinate system, when a coordinate point A of the emission color at an early stage of use is represented by $(x_1, y_1)$, and a coordinate point B of the emission color deteriorated by use is represented by $(x_2, y_2)$, the organic electroluminescence element satisfies a relation of $y_2 \geq y_1$. When amounts of changes in an x value and a y value from the coordinate point A to the coordinate point B are represented by equations of $\Delta x = x_2 - x_1$ and $\Delta y = y_2 - y_1$ respectively, the organic electroluminescence element satisfies a relation of $\Delta y \geq \Delta x$.

In the above organic electroluminescence element, it is preferable that the coordinate point A and the coordinate point B satisfy a relation of $x_2 \geq x_1$.

In the above organic electroluminescence element, it is preferable that the organic electroluminescence element comprises a multi-unit structure in which the multiple light-emitting layers are distributed to multiple light-emitting units, and that the multiple light-emitting units include a blue-based light-emitting unit including the blue light-emitting layer and a non-blue-based light-emitting unit not including the blue light-emitting layer, and that in a case where the emission color of the organic electroluminescence element operated at the operation temperature for the stable state is represented in the CIE1931 chromaticity coordinate system, the organic electroluminescence element shows at least one of: a chromaticity change of the blue-based light-emitting unit in which an x value of the emission color deteriorated by use is greater than an x value of the emission color at the early stage of use; and a chromaticity change of the non-blue-based light-emitting unit in which a y value of the emission color deteriorated by use is greater than a y value of the emission color at the early stage of use.

In the above organic electroluminescence element, it is preferable that the organic electroluminescence element comprises a multi-unit structure in which the multiple light-emitting layers are distributed to multiple light-emitting units and that in a case where the emission color of the organic electroluminescence element operated at the operation temperature for the stable state is represented in the CIE1931 chromaticity coordinate system, a maximum color changing light-emitting unit is defined as the longest one, in a moving distance from the coordinate point of the emission color at the early stage of use to the coordinate point of the emission color deteriorated by use, of the multiple light-emitting layers, the coordinate point of the emission color of the maximum color changing light-emitting unit at the early stage of use is defined as a coordinate point $A_1$, the coordinate point of the emission color of the maximum color changing light-emitting unit deteriorated by use is defined as a coordinate point $B_1$, and an x value and a y value of the coordinate point $A_1$ are respectively smaller than an x value(s) and a y value(s) of a coordinate point(s) of the emission color(s) of the other(s) of the multiple light-emitting layers at the early stage of use.

In the above organic electroluminescence element, it is preferable that the maximum color changing light-emitting unit includes the blue light-emitting layer.

In the above organic electroluminescence element, it is preferable that a light-emitting layer which is the largest in a y value in the CIE1931 chromaticity coordinate system of the multiple light-emitting layers is larger in thickness than the other(s) of the multiple light-emitting layers.

In the above organic electroluminescence element, it is preferable that a light-emitting layer which is the largest in a y value in the CIE1931 chromaticity coordinate system of the multiple light-emitting layers is in contact with another of the multiple light-emitting layers at one of opposite layer interfaces and is not in contact with another of the multiple light-emitting layers at the other of the opposite layer interfaces.

In the above organic electroluminescence element, it is preferable that the organic electroluminescence element has white emission color.

The lighting device according to the present invention includes the above organic electroluminescence element.

Advantageous Effects of Invention

According to the present invention, it is possible to obtain an organic electroluminescence element and a lighting device which are capable of suppressing change in an emission color in actual use by making it difficult to perceive change in the emission color and have prolonged lifetime.

DESCRIPTION OF EMBODIMENTS

Figure 1A:
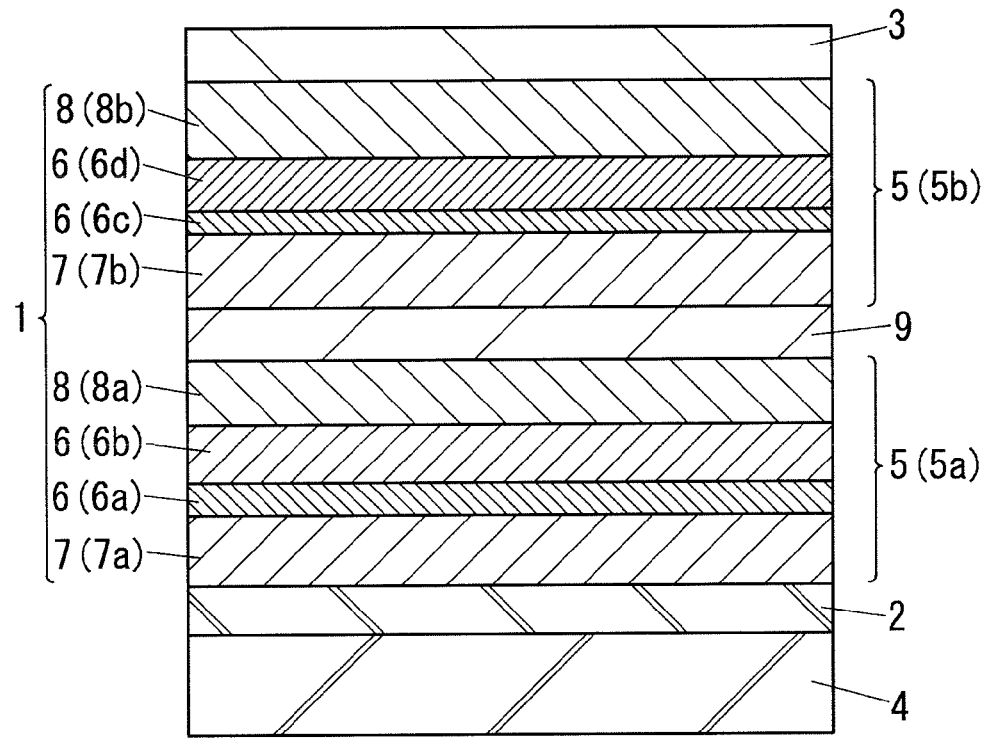
FIG. 1A is a schematic section illustrating an example of a layer configuration of an organic electroluminescence element.

FIG. 1A is one example of an embodiment of an organic electroluminescence element (organic EL element). The organic EL element has a structure in which an organic layer 1 is interposed between an anode 2 and a cathode 3. The organic layer 1 includes multiple light-emitting layers 6. The multiple light-emitting layers 6 include a blue light-emitting layer including a blue light-emitting dopant. In the present embodiment, the multiple light-emitting layers 6 further include non-blue light-emitting layer which is not including a blue light-emitting dopant. In more detail, in the present embodiment, the multiple light-emitting layers 6 are four light-emitting layers 6 which are a first light-emitting layer 6a, a second light-emitting layer 6b, a third light-emitting layer 6c, and a fourth light-emitting layer 6d, and at least one of these is a blue light-emitting layer and the other(s) is a non-blue light-emitting layer. It is preferable that the multiple light-emitting layers 6 include a non-blue light-emitting layer which is a red light-emitting layer including a red light-emitting dopant and another non-blue light-emitting layer which is a green light-emitting layer including a green light-emitting dopant. By using three light-emitting dopants of red, blue and green, rays of light of these dopants are mixed and thus light of a desired color can be obtained. Further, it is possible to easily obtain white light emission by mixing (superposing) rays of light of these three colors. In FIG. 1A, the number of light-emitting layers 6 is four but the number of light-emitting layers 6 may be five or more.

The organic EL element of the present embodiment includes a substrate 4 which is on an opposite surface of the anode 2 from the organic layer 1. This organic EL element is formed by forming the anode 2 on a surface of the substrate 4, and stacking individual layers of the organic layer 1 on the anode 2 in the order, and placing the cathode 3 on the organic layer 1.

The anode 2 and the substrate 4 may be transparent. When a transparent electrode and a transparent substrate are used as the anode 2 and the substrate 4, the anode 2 and the substrate 4 can transmit light produced by the organic layer 1 and therefore it is possible to allow light to emerge outside from the substrate 4. In other words, the organic EL element may have a so-called bottom emission structure which allows light to emerge from the substrate 4. Further, the cathode 3 may be transparent. When the cathode 3 is transparent, it is possible to allow light to emerge from the cathode 3. In short, the organic EL element may have a so-called top emission structure which allows light to emerge from the opposite side of the substrate 4. In this case, it is not required that the substrate 4 and the anode 2 are transparent. Further, the substrate 4, the anode 2 and the cathode 3 may be transparent, and in this case it is possible to form a structure which allows light to emerge from each side.

Further, the substrate 4 may be provided adjacent to the cathode 3. In this case, it is possible to obtain the organic EL element with a so-called reversed layer structure (layers are stacked in the order from the cathode). Further, it is preferable that an electrode (e.g., the cathode 3) on the opposite side from a light emergence side be a light reflective electrode. When this electrode is light reflective, it is possible to convert light traveling toward the opposite side from the light emergence side into light traveling toward the light emergence side by reflection, and thereby a light-outcoupling efficiency can be improved. Note that, the organic EL element is normally enclosed, and hence a stack including the organic layer 1 may be enclosed by use of an enclosing substrate facing the substrate 4.

The anode 2 is an electrode for providing holes to the organic layer 1. Further, the cathode 3 is an electrode for providing electrons to the organic layer 1. In the present embodiment it is possible to form the anode 2 as a transparent electrode and form the cathode 3 as a light reflective electrode. Further, the organic layer 1 can be provided as a layer interposed between the anode 2 and the cathode 3 constituting a pair of electrodes.

The light-emitting layers 6 provided to the organic layer 1 are layers including light-emitting dopants. The light-emitting layers 6 are layers formed by doping a layer medium serving as a so-called host with a light-emitting dopant serving as a so-called guest, generally.

The organic layer 1 normally includes layers for injection and movement of electric charges for light emission of the light-emitting layers 6. The layers having such functions may include a hole transport layer 7 and an electron transport layer 8, for example, and the embodiment shown in FIG. 1A includes these layers. Further, the organic layer 1 may include a hole injection layer and an electron injection layer. The hole injection layer may be provided as a layer between the anode 2 and the hole transport layer 7. Further, the electron injection layer may be provided as a layer between the cathode 3 and the electron transport layer 8.

Each of the multiple light-emitting layers 6 includes at least one light-emitting dopant. One light-emitting layer 6 may include a single light-emitting dopant. Further, one light-emitting layer 6 may include two or three or more light-emitting dopants.

It is preferable that the light-emitting layers 6 include, as a whole, three types of dopants which are a blue light-emitting dopant, a green light-emitting dopant, and a red light-emitting dopant. For example when the organic layer 1 includes a blue light-emitting layer including a blue light-emitting dopant, a green light-emitting layer including a green light-emitting dopant, and a red light-emitting layer including a red light-emitting dopant, an element including dopants with three colors can be formed. Alternatively, by providing at least one light-emitting layer 6 including light-emitting dopants with different colors, it is possible to form an element which includes dopants with three colors as a whole.

The organic EL element of the present embodiment has a multi-unit structure in which the multiple light-emitting layers 6 are distributed to multiple light-emitting units 5. The multi-unit structure means a structure in which multiple groups of light-emitting layers including one light-emitting layer 6 or two or more stacked light-emitting layers 6 are stacked with other layer(s) in-between. A structural unit for light emission including one group of light-emitting layers constitutes one light-emitting unit 5. The light-emitting unit 5 may be a stack structure which produces light in response to application of voltage between an anode layer and a cathode layer. In this regard, it is preferable that an interlayer 9 be interposed between adjacent light-emitting units 5. The interlayer 9 is a layer for facilitating movement of electric charges (movement of electrons and holes) between units. By providing the interlayer 9, it is possible to improve a light producing performance of the organic EL element.

In the organic EL element of FIG. 1A, the first hole transport layer 7a, the first light-emitting layer 6a, the second light-emitting layer 6b, the first electron transport layer 8a, the interlayer 9, the second hole transport layer 7b, the third light-emitting layer 6c, the fourth light-emitting layer 6d, and the second electron transport layer 8b are stacked in this order from the anode 2 and thereby the organic layer 1 is formed. The first light-emitting unit 5a is constituted by the first hole transport layer 7a, the first light-emitting layer 6a, the second light-emitting layer 6b, and the first electron transport layer 8a. The second light-emitting unit 5b is constituted by the second hole transport layer 7b, the third light-emitting layer 6c, the fourth light-emitting layer 6d, and the second electron transport layer 8b. The interlayer 9 is interposed between the first light-emitting unit 5a and the second light-emitting unit 5b. According to such a multi-unit structure, luminous intensity can be improved, and additionally light with mixed color is produced by the multiple light-emitting layers 6 and thus a desired emission color can be obtained. Note that, the number of light-emitting layers 6 in one light-emitting unit 5 is not limited to two, and may be one or three or more. Further, the number of light-emitting layers 6 may be different between the first light-emitting unit 5a and the second light-emitting unit 5b. Further, the organic EL element may include three or more light-emitting units 5.

The organic EL element of the present embodiment is configured so that in a case where emission color of the organic electroluminescence element operated at an operation temperature for a stable state is represented in a CIE1931 chromaticity coordinate system, when a coordinate point A of the emission color at an early stage of use is represented by $(x_1, y_1)$ and a coordinate point B of the emission color at a deteriorated state by use is represented by $(x_2, y_2)$, a relation of $y_2 \geq y_1$ is satisfied. By doing so, it is possible to make it difficult to perceive change in luminance, and therefore change in the emission color in actual use can be suppressed. By preventing a decrease in the y value or increasing the y value when light emission is deteriorated by use, it is possible to make it difficult to perceive change in the emission color in a sense of ergonomics even when the emission color is changed in a sense of numerical values strictly indicating the emission color. Hence, change in the emission color in actual use can be prevented, and the lifetime of the organic EL element can be prolonged. With regard to the relation of the y value between the coordinate point A and the coordinate point B, it is more preferable that a relation of $y_2 > y_1$ is satisfied. In this case, it is possible to make it more difficult to perceive change in the emission color.

In the organic EL element of the present embodiment, when amounts of changes in the x value and the y value from the coordinate point A $(x_1, y_1)$ to the coordinate point B $(x_2, y_2)$ are represented by equations of $\Delta x = x_2 - x_1$ and $\Delta y = y_2 - y_1$ respectively, the organic electroluminescence element satisfies a relation of $\Delta y \geq \Delta x$. Therefore, a color can be changed so that perception of change in luminance becomes difficult, and hence it is possible to make it difficult to perceive change in the emission color. To make it more difficult to perceive change in the emission color, it is more preferable that a relation of $\Delta y > \Delta x$ be satisfied.

Further, in the organic EL element, it is preferable that the coordinate point A and the coordinate point B satisfy a relation of $x_2 \geq x_1$. Therefore, it is possible to make it difficult to perceive change in chromaticity, and change in the emission color in actual use can be reduced. By preventing a decrease in the x value or increasing the x value when light emission is deteriorated by use, it is possible to make it difficult to perceive change in the emission color in a sense of ergonomics even when the emission color is changed in a sense of numerical values strictly indicating the emission color. Hence, change in the emission color in actual use can be prevented, and the lifetime of the organic EL element can be prolonged. With regard to the relation of the x value between the coordinate point A and the coordinate point B, it is more preferable that a relation of $x_2 > x_1$ is satisfied. In this case, it is possible to make it more difficult to perceive change in the emission color.

In this regard, the operation temperature for the stable state may be an ordinary temperature (e.g., 20° C. or 5 to 35° C.). Further, the early stage of use means a stage in which light is emitted when a voltage is applied first time after production of the element. Further, the deteriorated state by use means a state in which measured luminance of the emitted light is 70% of luminance at the early stage of use (i.e., 100%). The luminance may be measured by a luminance meter. Alternatively, the deteriorated state by use may mean a state in which movement of a position of a chromaticity coordinate point of emission color in the CIE1931 chromaticity coordinate system occurs (or such movement is confirmed).

In the past, for example, to reduce change in the chromaticity of lighting as possible, it has been considered that decreases in emission colors of the organic EL element are adjusted to a similar extent. In this case, it is difficult to obtain the maximum lifetime performances (maintenance of luminance) of the emission colors. Further, in a case of setting the lifetime performances (maintenance of luminance) of the emission colors to their maximums, change in the chromaticity with deterioration may occur, and thus accurate reproduction of color becomes difficult, and in some case, the emission colors may become uncomfortable colors for a person. In view of such uncomfortable feelings, adjustment is conducted to prevent change in the chromaticity of lighting as possible. However, there is a problem that achieving both maintaining the chromaticity and prolonging the lifetime is somehow difficult. In summary, the luminance and the chromaticity are in a trade-off relation, and hence it is difficult to improve the both. However, in the organic EL element of the present embodiment, a relation between the chromaticity at the early stage and the chromaticity when the light emission is deteriorated is set to the aforementioned relation. By doing so, the light emission is controlled in consideration of ergonomics, and a visual illusion such as different emission colors appearing to be the same occurs. Consequently, it is made difficult to perceive change in the emission color. Hence, both maintenance of the luminance and reduction of change in the chromaticity can be achieved, and the lifetime of the organic EL element can be prolonged.

Figure 1B:
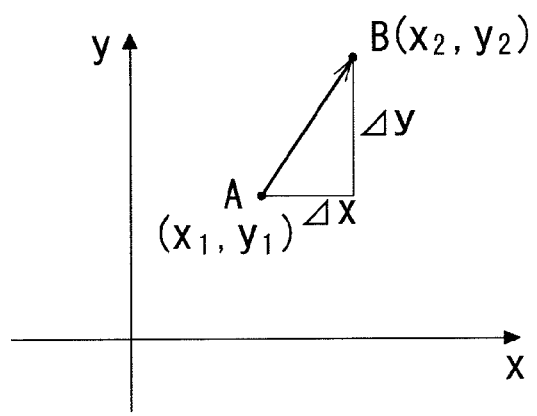
FIG. 1B is a schematic graph illustrating change in chromaticity of an organic electroluminescence element in a CIE1931 chromaticity coordinate system.

FIG. 1B shows the coordinate point A of the chromaticity of the emission color at the early stage of use and the coordinate point B of the chromaticity of the emission color in the deteriorated state by use in the CIE1931 chromaticity coordinate system. In the organic EL element, the emission color changes by use. In FIG. 1B, such change in the chromaticity is indicated by an arrow (vector) from the coordinate point A to the coordinate point B.

Figure 4:
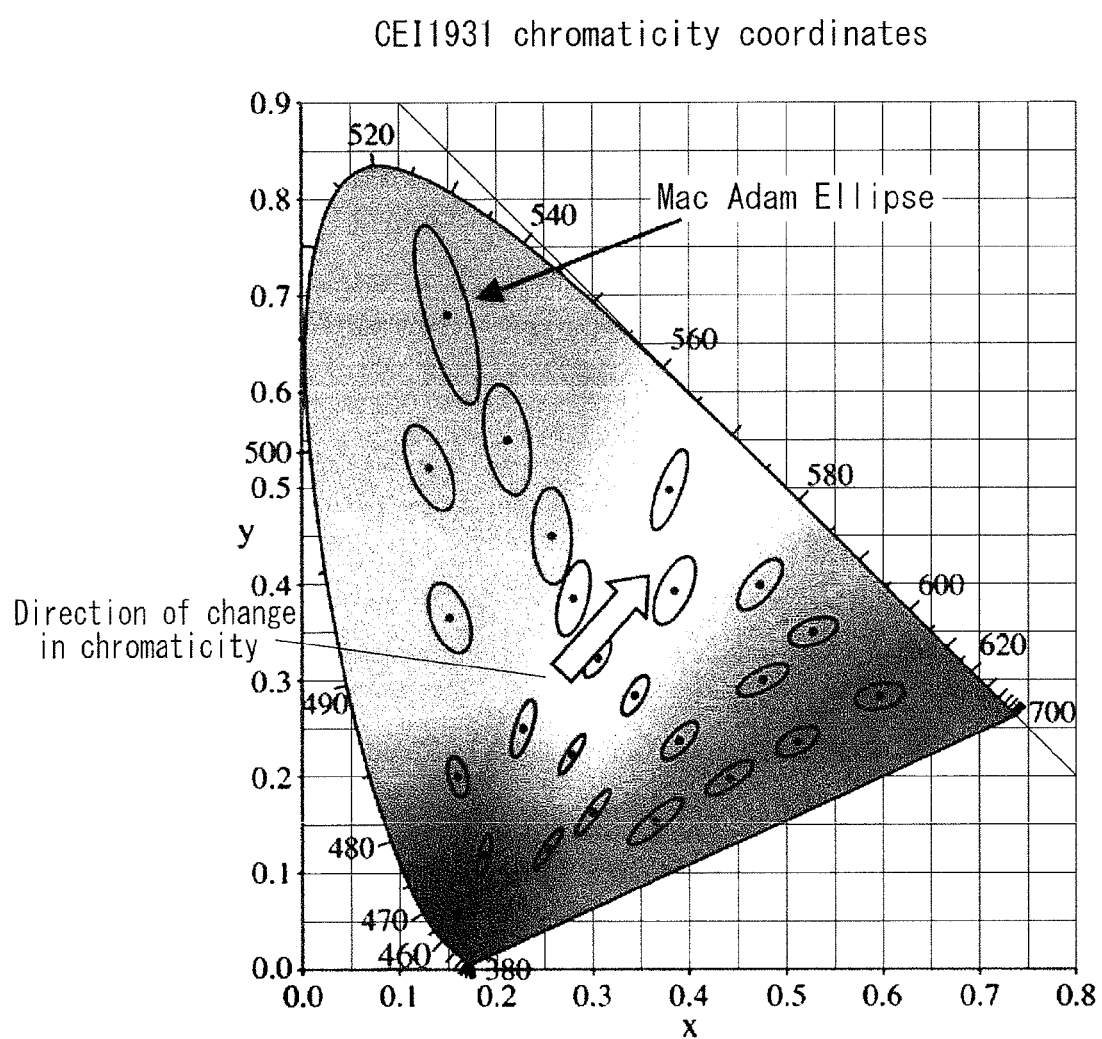
FIG. 4 is a graph illustrating CIE1931 chromaticity coordinates.

FIG. 4 shows a graph illustrating CIE1931 chromaticity coordinates. In the CIE1931 chromaticity coordinate system, the color is represented in a two-dimensional manner by use of the x value and the y value, and the chromaticity of the emission color is also defined by use of the x value and the y value. Generally, an area of color represented by the chromaticity coordinates can be represented as an area surrounded by lines including an inverted U-shape curve which is inclined left and has its vertex on an upper left side (colored area in FIG. 4). In the chromaticity coordinates, a green value increases toward an upper side, a blue value increases toward a left-lower side, and a red value increases toward a right-lower side. The numerical values put outside the curve and along the curve denote wavelengths (nm) of light.

FIG. 4 shows the Mac Adam ellipse in the CIE1931 chromaticity coordinates. The Mac Adam ellipse is obtained by visual color matching and shows an xy chromaticity diagram illustrating standard deviations of identification variations from a specific central color. It is known that when the Mac Adam ellipse is represented by the standard deviation, this ellipse does not indicate a color difference visually identified as is, and the identification threshold is an about triple (3-STEP) of the standard deviation. FIG. 4 shows the twenty-five Mac Adam ellipses. In a similar manner, the Mac Adam ellipse may be set with regard to any point selected from the chromaticity coordinate points (colored area). When an intended color is deviated from a certain point, change of the chromaticity is not likely to be perceived in the meaning of ergonomics as long as the intended color stays inside the area of the Mac Adam ellipse (color matching ellipse). The Mac Adam ellipse may be referred to as a color matching sensitivity ellipse.

As shown in FIG. 4, the Mac Adam ellipse is an ellipse substantially elongated in a y-axis direction. Hence, when an intended color is deviated in the y-axis direction, the coordinate point of the deviated intended color is likely to stay in the area of the Mac Adam ellipse. Consequently, color deviation is unlikely to be perceived.

Figure 5:
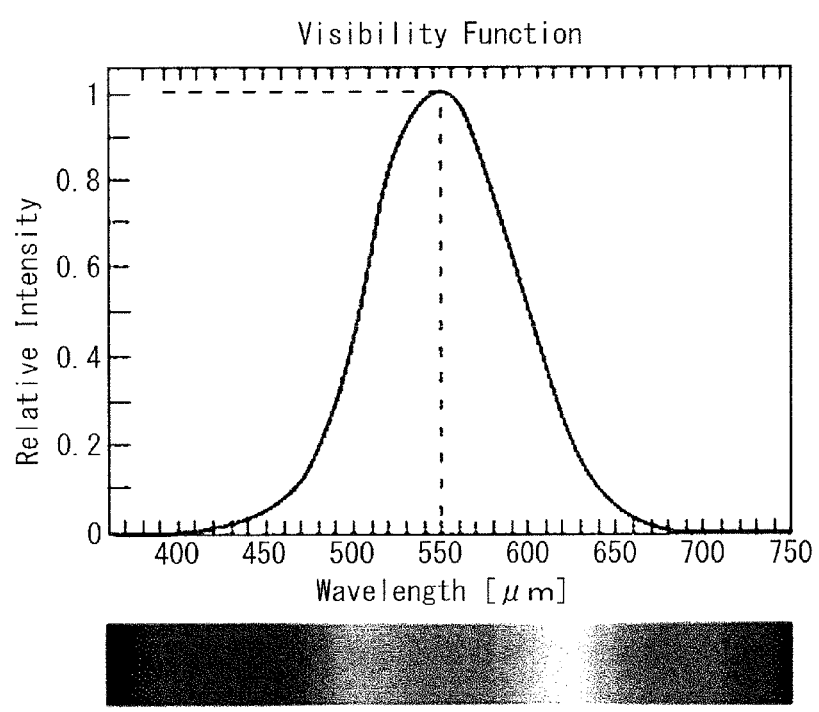
FIG. 5 is a graph illustrating a visibility function.

FIG. 5 shows a graph illustrating a visibility function. The visibility means a difference in intensity of emission light perceived by a person according to a difference in a wavelength of light (difference in color). In FIG. 5, a lateral axis denotes a wavelength of light and a vertical axis denotes a relative intensity. As apparent from this graph, the visibility for light is the highest at the wavelength of 550 nm. Light with a wavelength near 550 nm is green light. In summary, the green light gives great effects on ergonomic feeling of color. Therefore, when change in intensity of the green light occurs, change in luminance or chromaticity of light may be perceived well. Further, when the intensity of the green light increases, it makes difficult to perceive a decrease in the luminance. In the organic EL element of the present embodiment, the y value of the coordinate point A is equal to or smaller than the y value of the coordinate point B so that the y value increases with an increase in a duration of use. In other words, as the duration of use increases, the coordinate point of the current emission color moves closer to a green region of an upper side of in the CIE1931 chromaticity coordinates. Further, the relation of $\Delta y \geq \Delta x$ is fulfilled, and an increasing rate of the y value is greater than an increasing rate of the x value. Therefore the current coordinate point moves much closer to the green region. Consequently, when the luminance decreases and the light emission deteriorates, color changes so that an increase in the luminance is perceived. Hence, it is made difficult to feel weakening of the luminance, and it is possible to reduce a decrease in the luminance in actual use.

Further, as shown in FIG. 4, the Mac Adam ellipse is an ellipse which is inclined so that a major axis extends in a right-upper direction in many cases. Therefore, when the x value increases with an increase in the y value caused by change in color, the coordinate point of changed color is likely to be inside the area of the Mac Adam ellipse. When the coordinate point A and the coordinate point B stay inside the area of the Mac Adam ellipse, it is made difficult to feel change in the chromaticity. In view of this, it is preferable that the x value of the coordinate point A be equal to or less than the x value of the coordinate point B so that the x value increases with an increase in a duration of use.

Figure 6:
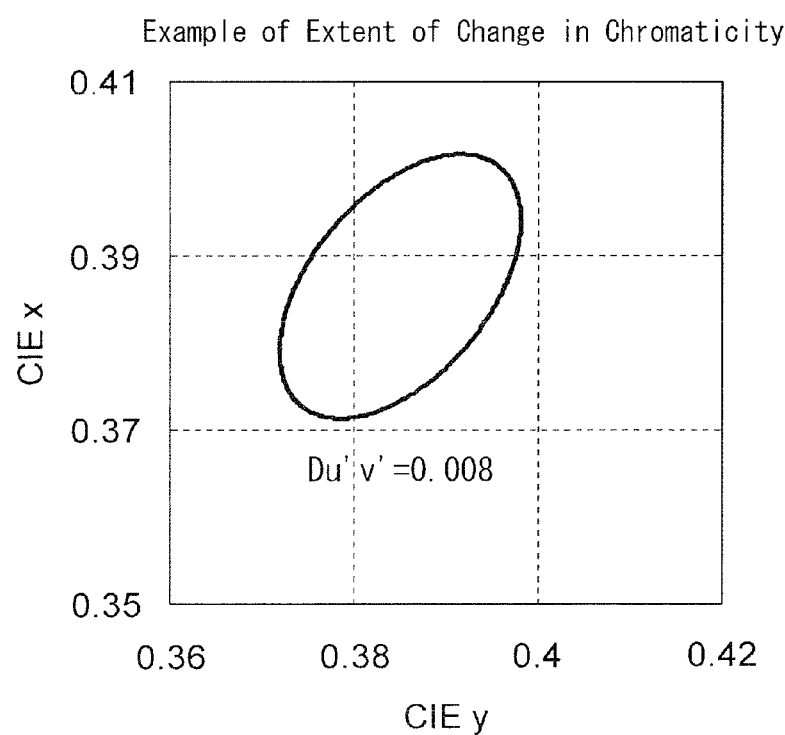
FIG. 6 is a graph illustrating an example of an extent of change in chromaticity.

FIG. 6 shows a graph illustrating an example of an area, in which change in color is not perceived in an ergonomics view point even when the chromaticity changes, in the CIE1931 chromaticity coordinate system. The area in which change in color is not perceived is, for example, an area (area of Du'v'≤0.008) surrounded by Du'v'=0.008 with regard to a certain color, and this area has an ellipsoidal shape in the above xy chromaticity coordinate system. In short, this area is an ellipse like the Mac Adam ellipse. Note that, in this coordinate system, the x-axis is described as the vertical axis, and the y-axis is described as the lateral axis. However, when the x-axis is described as the lateral axis and the y-axis is described as the vertical axis, the area is represented as an ellipse with a major axis extending in a right-upper direction. Accordingly, it is understood that setting the x value and the y value in the aforementioned manner is preferable even in a case of using the ellipse (color matching sensitivity ellipse) of FIG. 6.

As shown in FIG. 1B, in the present embodiment, it is preferable that the coordinate point A $(x_1, y_1)$ of the chromaticity of the emission color at the early stage of use and the coordinate point B $(x_2, y_2)$ of the chromaticity of the emission color in the deteriorated state by use satisfy the following relation.

$$\Delta x = x_2 - x_1 \geq 0$$

$$\Delta y = y_2 - y_1 \geq 0$$

(except a case in which $\Delta x = 0$ and $\Delta y = 0$)

With regard to the coordinate point A and the coordinate point B, it is preferable that $\Delta y>0$, and additionally it is preferable that $\Delta x>0$ and $\Delta y>0$.

In other words, it is preferable that the arrow (vector) of change in the chromaticity from the coordinate point A to the coordinate point B shown in FIG. 1B extends in a right-upper direction. When the chromaticity changes in the right-upper direction from the coordinate point A to the coordinate point B, as described above, the chromaticity changes within the area (ellipse) in which change in the chromaticity is less likely to be perceived in the ergonomic sense, and thus it is made difficult to feel a decrease in the luminance and the chromaticity in actual use. Such suppressing of change in the emission color by adjusting the chromaticity is effective in the organic EL element including a blue light-emitting layer and a non-blue light-emitting layer. Generally, the blue light-emitting dopant tends to greatly deteriorate compared with other light-emitting dopants, and thus in the organic EL element including such a blue light-emitting dopant, color balance is likely to be lost and the emission color is likely to change. However, in the organic EL element with the chromaticity adjusted in the aforementioned manner, even when the blue light-emitting dopant deteriorates, it is made difficult to perceive a decrease in the luminance and change in the chromaticity, and therefore it can be made difficult to perceive change in the entire emission color. Consequently, it is possible to obtain the organic EL element which can suppress change in the emission color and has prolonged lifetime.

The chromaticity of the organic EL element can be calculated by an average of chromaticity with regard to a light-emitting region. For example, when the organic EL element in a panel shape has a surface for light emission, by averaging chromaticity of the entire light-emitting region, the chromaticity of the emission color of the element can be obtained. Further, the chromaticity at the center of the light-emitting region may be used. The center of the light-emitting region is a part where change in the chromaticity and a decrease in the luminance are likely to occur and also change in the emission color is likely to be perceived. Therefore, by making it difficult to perceive change of the chromaticity at this part, it is possible to obtain the organic EL element capable of reducing change in the emission color.

Further, in the organic EL element in a planar shape, it is preferable in view of occurrence of partial deterioration the chromaticity at a deteriorated part satisfy the above relation. In the organic EL element in a planar shape, at a partial region in the surface the luminance may decrease and the chromaticity changes, and therefore unevenly light emission may occur. Especially, in a lighting panel including the organic EL element as a planar light emitter, the light-emitting surface is relatively large. Therefore, when the chromaticity and the luminance partially change, the emission color becomes uneven in the surface, and the entire light-emitting performance may decrease. For this reason, in such an organic EL element in a planar shape, it is important that the emission color becomes more even. In view of this, by setting the relation of the chromaticity in the aforementioned manner by use of the chromaticity at the deteriorated part, it can be made difficult to perceive change in the emission color in the surface, and thus the light emission which becomes more even in the surface can be realized.

In the organic EL element with a multi-unit structure, when it is operated at the operation temperature for the stable state, in the CIE1931 chromaticity coordinate system, chromaticity may change in each of the multiple light-emitting units 5. In the organic EL element with a multi-unit structure, the multiple light-emitting units 5 can be configured to include a blue-based light-emitting unit including a blue light-emitting layer and a non-blue-based light-emitting unit which does not include a blue light-emitting layer. In such an organic EL element, when it is operated at the operation temperature for the stable state, in the CIE1931 chromaticity coordinate system, the organic EL element is preferably configured to show at least one of chromaticity changes of the following (i) and (ii), and is more preferably configured to show the chromaticity changes of (i) and (ii).

(i) in the blue-based light-emitting unit, the x value of the emission color in the deteriorated state by use is larger than the x value at the early stage of use.

(ii) in the non-blue-based light-emitting unit, the y value of the emission color in the deteriorated state by use is larger than the y value at the early stage of use.

As described above, when change in the emission color resulting from change in the luminance and the chromaticity occurs within the area of the color matching sensitivity ellipse, it is made difficult to perceive the change in the emission color in the ergonomic sense. In this regard, in the blue-based light-emitting unit, when the x value of the emission color in the deteriorated state by use is larger than the x value at the early stage of use, the chromaticity tends to change in a direction (right direction in the chromaticity coordinates) of increasing the x value with regard to the entire color coordinates of the organic EL element. Further, in the organic EL element, the entire color coordinates change in a direction of increasing the y value. In this case, the x value increases and thus the coordinate point moves in the right-upper direction along the major axis of the ellipse and therefore tends to stay inside the area of the ellipse. Hence, it can be made more difficult to perceive change in the emission color. Further, in the non-blue-based light-emitting unit, when the y value of the emission color in the deteriorated state by use is larger than the y value at the early stage of use, the chromaticity tends to change in a direction (upper direction in the chromaticity coordinates) of increasing the y value with regard to the entire color coordinates of the organic EL element. Further, in the organic EL element, when the entire color changes in a direction of increasing the y value, the color changes so that an increase in the luminance is perceived. As a result, it is made difficult to perceive weakening of the luminance, and therefore a decrease in the luminance in actual use can be reduced. Accordingly, it can be more difficult to perceive change in the emission color. As described above, when a particular light-emitting unit 5 shows a chromaticity change of either the above (i) or (ii), it is possible to suppress change in the entire emission color. Further, when particular light-emitting units 5 show chromaticity changes of the both (i) and (ii), it is possible to more suppress change in the entire emission color.

Further, in the organic EL element with a multi-unit structure, the light-emitting unit 5 which is the longest, in the moving distance from the coordinate point of the emission color at the early stage of use to the coordinate point of the emission color in the deteriorated state by use, of the multiple light-emitting units 5 is referred to as a maximum color changing light-emitting unit. In this regard, the coordinate point of the emission color of the maximum color changing light-emitting unit at the early stage of use is defined as a coordinate point $A_1$, the coordinate point of the emission color of the maximum color changing light-emitting unit in the deteriorated state by use is defined as a coordinate point $B_1$. Further, it is preferable that an x value and a v value of the coordinate point $A_1$ of the maximum color changing light-emitting unit be respectively smaller than an x value(s) and a y value(s) of a coordinate point(s) of the emission color(s) of the other(s) of the multiple light-emitting layers at the early stage of use. As described above, change in the emission color caused by changes in the luminance and the chromaticity may be easily perceived as the y value of color more increases. Therefore, with regard to the light-emitting unit 5 showing the longer moving distance, it is made difficult to perceive change in color by decreasing the y value. Further, when the y value is relatively small, by decreasing the x value, the coordinate positions of the chromaticity of the multiple light-emitting units 5 may tend to move in the right-upper direction along the shape of the Mac Adam ellipse and the chromaticity of the post-changed emission color may stay in the area of the ellipse. In view of this, it is preferable that the x value and the y value of the coordinate point $A_1$ of the maximum color changing light-emitting unit at the early stage of use be respectively smaller than an x value(s) and a y value(s) of a coordinate point(s) of the emission color(s) of the other(s) of the multiple light-emitting layers.

Figure 2:
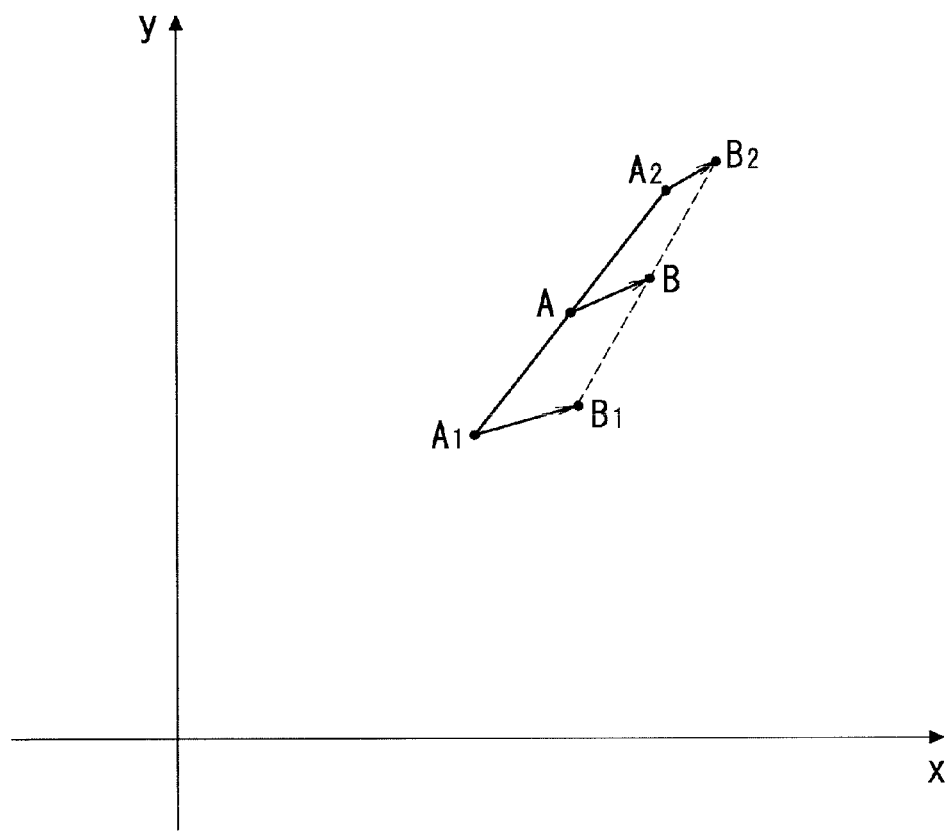
FIG. 2 is a schematic graph illustrating change in chromaticity of an organic electroluminescence element in a CIE1931 chromaticity coordinate system.

FIG. 2 relates to the organic EL element including the two light-emitting units 5 as with the embodiment shown in FIG. 1A, and shows change in the chromaticity of the entire organic EL element and changes in the chromaticity of the light-emitting units 5. At the early state of use, when the light-emitting unit 5 has the chromaticity at the coordinate point $A_1$ and the other light-emitting unit 5 has the chromaticity at the coordinate point $A_2$, the organic EL element has the emission color with the chromaticity at the coordinate point A having the x value and the y value which are averages of the x values and the y values of the coordinate points $A_1$ and $A_2$. When the chromaticity of the organic EL element moves from the coordinate point A to the coordinate point B by use, the coordinate points of the light-emitting units 5 also moves from the coordinate point $A_1$ to the coordinate point $B_1$ and from the coordinate point $A_2$ to the coordinate point $B_2$. In this regard, by comparing the moving distances of the coordinate points, the x value and the y value of the light-emitting unit 5 corresponding to the longest moving distance are set to be smallest. In FIG. 2, the distance from the coordinate point $A_1$ to the coordinate point $B_1$ is longer than the distance from the coordinate point $A_2$ to the coordinate point $B_2$, the light-emitting unit 5 corresponding to the coordinate point $A_1$ is set to be smaller in the x value and the y value than the light-emitting unit 5 corresponding to the coordinate point $A_2$. In this case, if the light-emitting unit 5 corresponding to the coordinate point $A_1$ which shows the longest moving distance is greater in at least one of the x value and the y value than the light-emitting unit 5 corresponding to the coordinate point $A_2$, change in color may be easily perceived. In view of this, the x value and the y value of the maximum color changing light-emitting unit are made small.

Further, in the embodiment shown in FIG. 2, the light-emitting unit 5 with the chromaticity at the coordinate point $A_1$ may be a blue-based light-emitting unit, and the light-emitting unit 5 with the chromaticity at the coordinate point $A_2$ may be a non-blue-based light-emitting unit. In this case, the blue-based light-emitting unit shows that its chromaticity moves in a direction of increasing the x value from the coordinate point $A_1$ to the coordinate point $B_1$. Further, the non-blue-based light-emitting unit shows that its chromaticity moves in a direction of increasing the y value from the coordinate point $A_2$ to the coordinate point $B_2$. Hence, it can be made more difficult to perceive change in the emission color.

In FIG. 2, a coordinate point of each of the light-emitting unit 5 with the chromaticity at the coordinate point $A_1$ and the light-emitting unit 5 with the chromaticity at the coordinate point $A_2$ moves so that the x value and the y value increase. However, a manner of movement of the coordinate point is not limited to the aforementioned manner as long as the above relation is fulfilled. For example, one or some of the multiple light-emitting units 5 may show that a coordinate point moves in a direction (left direction) of decreasing the x value. Further, one or some of the multiple light-emitting units 5 may shows that a coordinate point moves in a direction (lower direction) of decreasing the y value. When change in the chromaticity of the entire organic EL element or change in the chromaticity of the particular light-emitting unit 5 satisfies the aforementioned relation, it is possible to suppress change in the emission color. However, when the coordinate point moves in a manner shown in FIG. 2, it can be made more difficult to perceive change in the emission color.

Note that, in a case of using three or more light-emitting units 5, the emission color of the organic EL element is determined by a center of gravity of a figure obtained by connecting coordinate points of the light-emitting units 5. Further, in a case of using three or more light-emitting units 5, by increasing the x value by use of a blue-based light-emitting unit and/or by increasing the y value by use of a non-blue-based light-emitting unit, it can be made difficult to perceive change in color. Further, by making the x value and the y value of the coordinate point $A_1$ of the maximum color changing light-emitting unit at the early stage of use smaller than an x value(s) and a y value(s) of a coordinate point(s) of the emission color(s) of the other(s) of the multiple light-emitting layers, it can be made difficult to perceive change in color.

In the aforementioned multi-unit structure, it is preferable that the maximum color changing light-emitting unit include a blue light-emitting layer. In other words, the maximum color changing light-emitting unit serves as a blue-based light-emitting unit. Generally, a blue light-emitting dopant more easily deteriorates than green and red light-emitting dopants, and thus may cause change in color. By including a blue light-emitting dopant in the maximum color changing light-emitting unit which shows a relatively long moving distance by deterioration, it can be made difficult to perceive change in the emission color caused by deterioration in light emission. Further, it is preferable that the light-emitting unit 5 other than the maximum color changing light-emitting unit include the light-emitting layers 6 constituted by a non-blue light-emitting layer. In other words, at least one light-emitting unit other than the maximum color changing light-emitting unit may be a non-blue-based light-emitting unit. Hence, it can be made difficult to perceive change in the emission color.

When the organic layer 1 includes the multiple light-emitting layers 6, it is preferable that a light-emitting layer 6 which is the largest one in the y value in the CIE1931 chromaticity coordinate system of the multiple light-emitting layers 6 be larger in thickness than the other(s) of the light-emitting layers 6. As described above, the region in which the y value is relatively large may cause great effects on feelings of the intensity, and thus change in intensity of the light-emitting layers 6 with the largest y value possibly causes great effects on change in the emission color. Generally, when the light-emitting layer 6 deteriorates, a light-emitting position (light-emitting point) may be deviated in a thickness direction. Therefore when the light-emitting layer 6 greatly influencing change in color is thinned, a deviation of the light-emitting position may cause change in the light-emitting intensity and thus change in color may be easily perceived. In view of this, the light-emitting layer 6 with the largest y value is made to be the thickest of the light-emitting layers 6, and thus it can be made more difficult to perceive change in the emission color.

When the organic layer 1 includes the multiple light-emitting layers 6, it is preferable that a light-emitting layer 6 which is the largest in the y value in the CIE1931 chromaticity coordinate system of the multiple light-emitting layers 6 be in contact with another of the multiple light-emitting layers 6 at one of opposite layer interfaces and be not in contact with another of the multiple light-emitting layers 6 at the other of the opposite layer interfaces. As described above, the region in which the y value is relatively large may cause great effects on feelings of the intensity, and thus change in intensity of the light-emitting layer 6 with the largest y value possibly causes great effects on change in the emission color. Generally, when the light-emitting layer 6 deteriorates, a light-emitting position (light-emitting point) may be deviated in a thickness direction. With regard to stacked parts (a group of light-emitting layers) of the light-emitting layers 6, such a deviation of this light-emitting point may easily occur at a central layer in a stacking direction than at an end layer in the thickness direction. In this regard, when the light-emitting layer 6 with the largest y value is present between other light-emitting layers 6, the deviation of the light-emitting position of the light-emitting layer 6 with the largest y value tends to increase, and thus change in color may be easily perceived. In view of this, the light-emitting layer 6 with the largest y value is placed such that one of opposite layer interfaces thereof is in contact with another light-emitting layer 6 and the other of the opposite layer interfaces is not in contact with another light-emitting layer 6, and therefore it can be made more difficult to perceive change in color.

Further, it is preferable that a light-emitting layer 6 which is the largest in the y value in the CIE1931 chromaticity coordinate system of the multiple light-emitting layers 6 be larger in thickness than the other(s) of the light-emitting layers 6 and be in contact with another of the multiple light-emitting layers 6 at one of opposite layer interfaces and be not in contact with another of the multiple light-emitting layers 6 at the other of the opposite layer interfaces. Generally, a layer at the end (layer interface) of the group of light-emitting layers tends to be unstable. Hence, when a light-emitting layer 6 which is relatively thin and has a relatively small y value is positioned at the end, the light emission of a light-emitting layer 6 which is relatively thin and has a relatively small y value may become weak, and its color becomes unstable. In view of this, by making the light-emitting layer 6 with the largest y value thicker than other light-emitting layer(s) 6 and disposing it at the end, it is possible to suppress instability of color and thus suppress change in the emission color.

Further, in a case where the organic EL element has a multi-unit structure of including the multiple light-emitting units 5, it is preferable that a light-emitting layer 6 having the largest y value in the multiple light-emitting unit 5 be lager in thickness than the other(s) of the light-emitting layers 6. Further, in a case where the organic EL element has a multi-unit structure of including the multiple light-emitting units 5, it is preferable that a light-emitting layer 6 having the largest y value in the multiple light-emitting unit 5 be in contact with another of the multiple light-emitting layers 6 at one of opposite layer interfaces and be not in contact with another of the multiple light-emitting layers 6 at the other of the opposite layer interfaces. With regard to the light-emitting unit 5, the light-emitting layer 6 with the relatively large y value is set in the aforementioned manner, and therefore for the same reason as described above, it can be made difficult to perceive change in the emission color.

It is preferable that the organic EL element has a white emission color. When the emission color of the organic EL element is white, the organic EL element can be easily applied to lighting, and a light-emitting device for lighting can be obtained. Further, in the white organic EL element, deterioration can be easily perceived based on change in the emission color. However, in such a white organic EL element, it can be made difficult to perceive change in the emission color and can more prolong the lifetime.

In the white organic EL element, when $\Delta x = x_2 - x_1$ and $\Delta y = y_2 - y_1$ which are amounts of changes in the x value and the y value from the above coordinate point A to the above coordinate point B satisfy a relation of $\Delta y \geq \Delta x$, it can be made more difficult to perceive change in color. As illustrated in the chromaticity coordinates shown in FIG. 4, with regard to the color matching sensitivity ellipse of the white area, an inclined angle of the lengthwise direction (major axis) of the ellipse to the x-axis is 45 degrees or more. Therefore, when the relation of $\Delta y \geq \Delta x$ is satisfied, it can be made more difficult to perceive change in the emission color.

A light-emitting dopant included in the light-emitting layer 6 may cause fluorescence or phosphorescence. However, it is preferable that a light-emitting dopant of fluorescence and a light-emitting dopant of phosphorescence be not included in the same light-emitting layer 6. By doing so, it is possible to stabilize the light emission. Further, it is preferable that one or two or more light-emitting layers 6 (group of light-emitting layers) of one light-emitting unit 5 be not constituted by a stack of a layer of fluorescence and a layer of phosphorescence but be constituted by a light-emitting layers 6 of either fluorescence or phosphorescence. By doing so, it is possible to stabilize the light emission.

Further, when the organic EL element includes a red light-emitting layer and a green light-emitting layer as a non-blue light-emitting layer, it is preferable that deterioration of the red light-emitting layer progress faster than deterioration of the green light-emitting layer. In this case, chromaticity can be changed in a direction of increasing the y value. For example, when the emission light changes so as to cause an increase in a green component due to temporal change in a carrier balance caused by adjustment of materials of the light-emitting layers 6 and adjacent layers, it is made difficult to perceive change in the luminance, and change in the emission color can be suppressed.

Designing of the element based on change in the chromaticity can be implemented by use of simulation by electronic calculation on a computer, for example. By doing so, designing of the element can be facilitated. Further, the designing can be done based on a result of test of optical properties of the element which is actually prepared. In this case, the designing of the element can be done based on change in the chromaticity similar to an actual use level. By doing the simulation and the test of the prepared element, the element capable of suppressing change in the emission color can be designed efficiently. Note that, change in the emission color of each unit and change in emission color of a single light-emitting layer can be checked by adjusting a state of stacked layers (e.g., omitting undesired layers).

Next, the first aspect of a concrete layer structure is described with reference to an example of a preferable aspect according to the layer structure shown in FIG. 1A. In the layer structure of the first aspect, the first light-emitting unit 5a is a fluorescent light-emitting unit configured to cause fluorescence, and a second light-emitting unit 5b is a phosphorescent light-emitting unit configured to cause phosphorescence. In other words, the first light-emitting layer 6a and the second light-emitting layer 6b show fluorescence, and the third light-emitting layer 6c and the fourth light-emitting layer 6d show phosphorescence. Further, the first light-emitting layer 6a is a blue light-emitting layer, the second light-emitting layer 6b is a green light-emitting layer, the third light-emitting layer 6c is a red light-emitting layer, and the fourth light-emitting layer 6d is a green light-emitting layer. The light-emitting layers 6 of blue, green, and red include light-emitting dopants of blue, green, and red, respectively.

In the fluorescent light-emitting unit, it is preferable that the light-emitting layers 6 include a blue light-emitting layer. When the fluorescent light-emitting unit shows blue fluorescence, stable emission color can be obtained. For example, the fluorescent light-emitting unit which is constituted by at least one light-emitting layer 6 may be constituted by a single blue light-emitting layer, or a stack of multiple (e.g., two) blue light-emitting layers, or a stack of a blue light-emitting layer and a green light-emitting layer, or a stack of a blue light-emitting layer and a red light-emitting layer.

In the phosphorescent light-emitting unit, it is preferable that the light-emitting layers 6 do not include a blue light-emitting layer. When the phosphorescent light-emitting unit does not show blue phosphorescence, stable emission color can be obtained. Further, in the phosphorescent light-emitting unit, it is also preferable that the light-emitting layers 6 include a green light-emitting layer. Generally, phosphorescence is higher in intensity than fluorescence. When the phosphorescent light-emitting unit shows green phosphorescence, it is possible to obtain light with stable emission color and high intensity. For example, the phosphorescent light-emitting unit constituted by at least one light-emitting layer 6 may be constituted by a single red light-emitting layer or a single green light-emitting layer, or a stack of a red light-emitting layer and a green light-emitting layer. Further, as a light-emitting dopant, an orange or yellow light-emitting dopant may be used. For example, the phosphorescent light-emitting unit may include at least one of an orange light-emitting layer and a yellow light-emitting layer. In this case, color variations are increased, and it is possible to facilitate adjustment of the emission color to a desired color. Further, in a case of phosphorescence, an orange or yellow light-emitting dopant is easily available.

With regard to a relation of the thicknesses of the light-emitting layers 6, it is preferable that the second light-emitting layer 6b be thicker than the first light-emitting layer 6a and the fourth light-emitting layer 6d be thicker than the third light-emitting layer 6c. When the light-emitting layer 6 which is higher in the y value and the visibility in the light-emitting units is thicker, it can be made difficult to perceive change in the emission color.

Next, the second aspect is described with reference to another example of the preferable aspect according to the layer structure shown in FIG. 1A. In the layer structure of the second aspect, both the first light-emitting unit 5a and the second light-emitting unit 5b are phosphorescent light-emitting units configured to cause phosphorescence. In other words, all of the first light-emitting layer 6a, the second light-emitting layer 6b, the third light-emitting layer 6c, and the fourth light-emitting layer 6d show phosphorescence. In this aspect, the fluorescence is not shown. Further, the first light-emitting layer 6a is a red light-emitting layer, the second light-emitting layer 6b is a green light-emitting layer, the third light-emitting layer 6c is a red light-emitting layer, and the fourth light-emitting layer 6d is a blue light-emitting layer. The light-emitting layers 6 of blue, green, and red include light-emitting dopants of blue, green, and red, respectively.

In the present aspect, in the second light-emitting unit 5b, the light-emitting layers 6 include a blue light-emitting layer. Further, the first light-emitting unit 5a does not include a blue light-emitting layer. The light-emitting unit 5 constituted by at least one light-emitting layer 6 including a blue light-emitting layer may be constituted by a single blue light-emitting layer, or multiple (e.g., two) blue light-emitting layers, or a stack of a blue light-emitting layer and a green light-emitting layer, or a stack of a blue light-emitting layer and a red light-emitting layer.

Further, the light-emitting unit 5 constituted by at least one light-emitting layer 6 not including a blue light-emitting layer may be constituted by a single red light-emitting layer or a single green light-emitting layer, or a stack of a red light-emitting layer and a green light-emitting layer. Further, as a light-emitting dopant, an orange or yellow light-emitting dopant may be used. For example, the phosphorescent light-emitting unit may include at least one of an orange light-emitting layer and a yellow light-emitting layer. In this case, color variations are increased, and it is possible to facilitate adjustment of the emission color to a desired color. Further, in a case of phosphorescence, an orange or yellow light-emitting dopant is easily available.

With regard to a relation of the thicknesses of the light-emitting layers 6, it is preferable that the second light-emitting layer 6b be thicker than the first light-emitting layer 6a and the fourth light-emitting layer 6d be thicker than the third light-emitting layer 6c. When the light-emitting layer 6 which is higher in the y value and the visibility in the light-emitting units is thicker, it can be made difficult to perceive change in the emission color.

Figure 3:
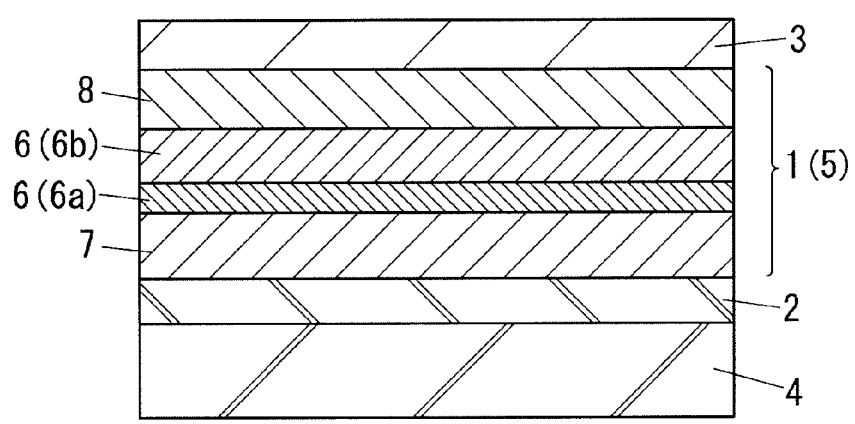
FIG. 3 is a schematic section illustrating an example of a layer configuration of an organic electroluminescence element.

FIG. 3 shows another example of the embodiment of the organic EL element. The components common to the elements of FIG. 3 and FIG. 1A are designated by the same reference signs, and the explanations thereof are omitted. The organic EL element has a structure in which an organic layer 1 is interposed between an anode 2 and a cathode 3. The organic layer 1 includes multiple light-emitting layers 6. The multiple light-emitting layers 6 include a blue light-emitting layer including a blue light-emitting dopant and a non-blue light-emitting layer not including a blue light-emitting dopant. In summary, in the present embodiment, the multiple light-emitting layers 6 are constituted by two light-emitting layers 6 which are the first light-emitting layer 6a and the second light-emitting layer 6b, and one of the two light-emitting layers 6 is a blue light-emitting layer, and the other of the two light-emitting layers 6 is a non-blue light-emitting layer. The non-blue light-emitting layer may be a red light-emitting layer including a red light-emitting dopant or a green light-emitting layer including a green light-emitting dopant. Further, the non-blue light-emitting layer may be a layer including a mixture of a red light-emitting dopant and a green light-emitting dopant. By using three light-emitting dopants of red, blue and green, rays of light of these dopants are mixed and thus light of a desired color can be obtained. Further, it is possible to easily obtain white light emission by mixing (superposing) rays of light of these three colors. Further, the non-blue light-emitting layer may be a light-emitting layer including an orange light-emitting dopant. When the orange light-emitting layer is used, by superposing orange and blue, white light emission can be obtained and nevertheless the number of light-emitting layers 6 can be decreased. Even in this case, the number of light-emitting layers 6 may be three or more.

The organic EL element of the present embodiment has a structure in which the multiple light-emitting layers 6 are not separated but are stacked. In other words, the number of light-emitting units 5 is one, and the organic EL element has a single unit structure. In the organic EL element of the embodiment of FIG. 3, the hole transport layer 7, the first light-emitting layer 6a, the second light-emitting layer 6b, and the electron transport layer 8 are stacked in this order from the anode 2, and thereby the organic layer 1 is formed. In a case of the single unit structure, the layer structure is simplified, and designing and producing of the organic EL element can be facilitated.

The organic EL element of the present embodiment is configured so that in a case where emission color of the organic electroluminescence element operated at an operation temperature for a stable state is represented in a CIE1931 chromaticity coordinate system, when a coordinate point A of the emission color at an early stage of use is represented by $(x_1, y_1)$ and a coordinate point B of the emission color at a deteriorated state by use is represented by $(x_2, y_2)$, a relation of $y_2 \geq y_1$ is satisfied. By doing so, it is possible to make it difficult to perceive change in luminance, and therefore change in the emission color in actual use can be suppressed. Hence, like the embodiment of FIG. 1A, it is possible to make it difficult to perceive change in the emission color in a sense of ergonomics even when the emission color is changed in a sense of numerical values strictly indicating the emission color. Hence, change in the emission color in actual use can be prevented, and the lifetime of the organic EL element can be prolonged. With regard to the relation of the y value between the coordinate point A and the coordinate point B, it is more preferable that a relation of $y_2 > y_1$ is satisfied. In this case, it is possible to make it more difficult to perceive change in the emission color. Note that, the coordinate point A and the coordinate point B may be same as those shown in FIG. 1B.

In the organic EL element of the present embodiment, when amounts of changes in the x value and the y value from the coordinate point A $(x_1, y_1)$ to the coordinate point B $(x_2, y_2)$ are represented by equations of $\Delta x = x_2 - x_1$ and $\Delta y = y_2 - y_1$ respectively, the organic electroluminescence element satisfies a relation of $\Delta y \geq \Delta x$. Therefore, a color can be changed so that perception of change in luminance becomes difficult, and hence it is possible to make it difficult to perceive change in the emission color. To make it more difficult to perceive change in the emission color, it is more preferable that a relation of $\Delta y > \Delta x$ be satisfied.

Further, in the organic EL element, it is preferable that the coordinate point A and the coordinate point B satisfy a relation of $x_2 \geq x_1$. Therefore, it is possible to make it difficult to perceive change in chromaticity, and change in the emission color in actual use can be reduced. Hence, like the embodiment shown in FIG. 1A, it is possible to make it difficult to perceive change in the emission color in a sense of ergonomics even when the emission color is changed in a sense of numerical values strictly indicating the emission color. Hence, change in the emission color in actual use can be prevented, and the lifetime of the organic EL element can be prolonged. With regard to the relation of the x value between the coordinate point A and the coordinate point B, it is more preferable that a relation of $x_2 > x_1$ is satisfied. In this case, it is possible to make it more difficult to perceive change in the emission color.

In the organic layer 1, it is preferable that a light-emitting layer 6 which is the largest one in the y value in the CIE1931 chromaticity coordinate system of the multiple light-emitting layers 6 be larger in thickness than the other(s) of the light-emitting layers 6. Thus it can be made more difficult to perceive change in the emission color. The reason is the same as reason described with reference to the embodiment of FIG. 1A.

Further, it is preferable that a light-emitting layer 6 which is the largest in the y value in the CIE1931 chromaticity coordinate system of the multiple light-emitting layers 6 is in contact with another of the multiple light-emitting layers 6 at one of opposite layer interfaces and is not in contact with another of the multiple light-emitting layers 6 at the other of the opposite layer interfaces. Thus it can be made more difficult to perceive change in the emission color. The reason is the same as reason described with reference to the embodiment of FIG. 1A.

Further, it is preferable that the organic EL element has a white emission color. When the white organic EL element satisfies the relation of $\Delta y \geq \Delta x$, it can be made more difficult to perceive change in color. The reason is the same as reason described with reference to the embodiment of FIG. 1A.

A light-emitting dopant included in the light-emitting layer 6 may cause fluorescence or phosphorescence. However, it is preferable that a light-emitting dopant of fluorescence and a light-emitting dopant of phosphorescence be not included in the same light-emitting layer 6. By doing so, it is possible to stabilize the light emission. Further, it is preferable that a whole of multiple light-emitting layers 6 (group of light-emitting layers) be constituted by not a stack of a fluorescent layer and a phosphorescent layer but the light-emitting layers 6 of either fluorescence or phosphorescence. By doing so, it is possible to stabilize the light emission.

The following is an example of a preferable aspect according to the layer structure of FIG. 3. In this aspect, the first light-emitting layer 6a is a non-blue light-emitting layer not including a blue light-emitting dopant, and the second light-emitting layer 6b is a blue light-emitting layer including a blue light-emitting dopant. The first light-emitting layer 6a and the second light-emitting layer 6b are units of either fluorescence or phosphorescence. The non-blue light-emitting layer includes at least one of a green light-emitting dopant and a red light-emitting dopant. Alternatively, the non-blue light-emitting layer may include an orange light-emitting dopant.

The following explanations are made to materials used in the organic EL elements of the embodiments described above and production methods of the organic EL elements.

The substrate 4 may be made of appropriate substrate material suitable for forming the organic EL element. For example, the substrate 4 may be made of a glass substrate or a resin substrate. In a case of using the glass substrate, it is possible to easily obtain a transparent substrate which has high light-outcoupling efficiency and high strength.

Each electrode (the anode 2 and the cathode 3) may be made as a transparent electrode or a reflective electrode by use of appropriate electrically conductive material.

The anode 2 may be preferably made of electrode material having a large work function, such as a metal, an alloy, an electric conductive compound, and a mixture of these. The material of the anode 2 may be selected from metal (e.g., gold), CuI, ITO (Indium Tin Oxide), $SnO_2$, ZnO, IZO (Indium Zinc Oxide), an electrically conductive polymer (e.g., PEDOT and polyaniline), an electrically conductive polymer doped with an arbitrary acceptor, and electrically conductive transparent material (e.g., a carbon nanotube), for example.

Further, it is preferable that the cathode 3 be made of electrode material having a small work function, such as a metal, an alloy, an electric conductive compound, and a mixture of these. The material of the cathode 3 may be selected from metal such as alkaline metal and alkaline earth metal, and an alloy of this metal and other metal. In more detail, the material of the cathode 3 may be sodium, an alloy of sodium and potassium, lithium, magnesium, a mixture of magnesium and silver, a mixture of magnesium and indium, and an alloy of aluminum and lithium. Further, the cathode 3 may include one layer or multiple stacked layers of electrically conductive material such as metal. For example, the cathode 3 may be a stack of layers of alkaline metal and Al, a stack of layers of alkaline earth metal and Al, a stack of layers of alkaline earth metal and Ag, or a stack of layers of a magnesium-silver alloy and Ag. Further, a structure of allowing light to emerge from the cathode 3 can be realized by use of a transparent electrode typically made of ITO, IZO or the like.

Each light-emitting layer 6 is made by use of guest material being a dopant compound (light-emitting dopant) and host material in which the dopant compound is included.

The host material of the phosphorescent layer may be CBP, CzTT, TCTA, mCP, or CDBP. A phosphorescent green light-emitting dopant may be $Ir(ppy)_3$, $Ir(ppy)_2(acac)$, or $Ir(mppy)_3$. A phosphorescent red light-emitting dopant may be $Btp_2Ir(acac)$, $Bt_2Ir(acac)$, or PtOEP. A phosphorescent blue light-emitting dopant may be FIr(pic). A doping concentration of a phosphorescent light-emitting dopant may be in a range of 1 to 40% by mass.

The host material of the fluorescent layer may be $Alq_3$, ADN, BDAF, or TBADN. A fluorescent green light-emitting dopant may be C545T, DMQA, coumarin6, or rubrene. A fluorescent blue light-emitting dopant may be TBP, BCz-VBi, or perylene. A fluorescent red light-emitting dopant may be DCJTB. Further, the fluorescent layer may include an electric charge movement assisting dopant which may be NPD, TPD, or Spiro-TAD, for example. A doping concentration of a total of the light-emitting dopant and the electric charge movement assisting dopant may be in a range of 1 to 30% by mass.

The blue light-emitting dopant is not limited if the blue light-emitting dopant can cause blue emission color. For example, the blue light-emitting dopant shows a light emission spectrum whose maximum value is present at a wavelength in a range of about 400 to 490 nm and in a preferable range of about 430 to 490 nm. Further, the green light-emitting dopant is not limited if the green light-emitting dopant can cause green emission color. For example, the green light-emitting dopant shows a light emission spectrum whose maximum value is present at a wavelength in a range of more than 490 nm to 580 nm and in a preferable range of about 500 to 570 nm. Further, the red light-emitting dopant is not limited if the red light-emitting dopant can cause red emission color. For example, the red light-emitting dopant shows a light emission spectrum whose maximum value is present at a wavelength in a range of more than 580 nm to 750 nm and in a preferable range of about 590 to 650 nm. Note that, the yellow light-emitting dopant shows a light emission spectrum whose maximum value is present at a wavelength in a range of about 570 to 590 nm, and the orange light-emitting dopant shows a light emission spectrum whose maximum value is present at a wavelength in a range of about 590 to 620 nm.

The interlayer 9 may be made of BCP:Li, ITO, NPD:$MoO_3$, or Liq:Al. For example, the interlayer 9 may have a double layer structure including a first layer of BCP:Li close to the anode 2 and a second layer of ITO close to the cathode 3.

The hole injection layer may be made of CuPc, MTDATA, TiOPC, or HAT-CN6. Further, the hole injection layer may be made of hole transport organic material doped with an acceptor. This acceptor may be exemplified by $MoO_3$, $V_2O_5$, and F4TCNQ.

The hole transport layer 7 may be made of TPD, NPD, TPAC, DTASi, or a triarylamine-based compound.

The electron transport layer 8 may be made of BCP, TAZ, BAlq, $Alq_3$, OXD7, or PBD.

The electron injection layer may be made of a compound (e.g., fluoride, oxide, and carbonate) of metal (e.g., alkaline metal and alkaline earth metal) such as LiF, $Li_2O$, MgO, or $Li_2CO_3$. Further, the electron injection layer may be a layer formed by doping an organic layer with metal (e.g., alkaline metal and alkaline earth metal) such as lithium, sodium, cesium and calcium.

Note that, with regard to the aforementioned material, CBP represents 4,4'-N,N'-dicarbazolebiphenyl. Further, $Alq_3$ represents tris-(8-oxoquinoline)aluminum (III). Further, TBADN represents 2-t-butyl-9,10-di(2-naphthyl)anthracene. Further, $Ir(ppy)_3$ represents fac-tris(2-phenylpyridine)iridium. Further, $Btp_2Ir(acac)$ represents bis-(3-(2-(2-pyridyl)benzothienyl)mono-acetylacetonate)iridium(III)). Further, C545T means coumarinC545T, and represents 10-2-(benzothiazolyl)-2,3,6,7-tetrahydro-1,1,7,7-tetramethyl-1H,5H,11H-(1)benzopyro pyrano(6,7,-8-ij)quinolizin-11-one. Further, TBP represents 1-tert-butyl-perylene. Further, NPD represents 4,4'-bis[N-(naphthyl)-N-phenylamino]biphenyl. Further, BCP represents 2,9-dimethyl-4,7-diphenyl-1,10-phenanthroline. Further, CuPc represents copper phthalocyanine. Further, TPD represents N,N'-bis(3-methylphenyl)-(1,1'-biphenyl)-4,4'-diamine.

By stacking layers in an appropriate order formed by use of the aforementioned materials by appropriate methods, the organic EL element with the layer structure as shown in FIG. 1A or FIG. 3 can be produced.

Each electrode may have a thickness in a range of about 10 to 300 nm, for example. The organic layer 1 may have a whole thickness in a range of about 60 to 300 nm, for example.

A method of forming films is not limited particularly but may be vacuum deposition, sputtering, or coating, for example.

In this regard, to realize stable surface light emission, it is preferable that each layer be formed so that a thickness is uniform in a plane as possible. For example, in a case of the vacuum deposition, a variation in thickness can be reduced by appropriately selecting an angle of an evaporation source, a distance (height) between a substrate and an evaporation source, a distance (offset) between a center of rotation of a substrate and an evaporation source, and the like. Therefore, it is possible to obtain a layer satisfying a desired thickness condition.

With reference to FIG. 1A and FIG. 3, the organic EL element including a non-blue light-emitting layer is described. In the organic EL element, a non-blue light-emitting layer is optional. In this case, all the multiple light-emitting layers 6 are constituted by blue light-emitting layers. For example, in the layer structure of FIG. 1A, the second light-emitting layer 6b and the fourth light-emitting layer 6d may be omitted, and the multiple light-emitting layers 6 may include only the first light-emitting layer 6a and the third light-emitting layer 6c, and the first light-emitting layer 6a and the third light-emitting layer 6c may be blue light-emitting layers. In this regard, at least one of the first light-emitting layer 6a and the third light-emitting layer 6c may include at least one of green light-emitting material and red light-emitting material. When the multiple light-emitting layers 6 include red, green, and blue light-emitting materials as a whole, white light emission can be realized more easily. Further, for example, in the layer structure of FIG. 3, each of the first light-emitting layer 6a and the second light-emitting layer 6b may be a blue light-emitting layer. In this regard, at least one of the first light-emitting layer 6a and the second light-emitting layer 6b may include at least one of green light-emitting material and red light-emitting material. When the multiple light-emitting layers 6 include red, green, and blue light-emitting materials as a whole, white light emission can be realized more easily.

A lighting device includes the aforementioned organic EL element. By use of the aforementioned organic EL element, it is possible to obtain the lighting device which can suppress change in the emission color in actual use by making it difficult to perceive change in the emission color, and can have prolonged lifetime. The lighting device may include a wiring structure for supplying electricity to the organic EL element. The lighting device may include a housing for supporting the organic EL element. The lighting device may include a plug for interconnecting the organic EL element and a power supply. The lighting device may be formed into a panel shape. The lighting device can be thinned, and thus it is possible to propose a lighting fixture for saving space.

EXAMPLES

Test Example 1

With regard to the organic EL element with the multi-unit structure defined by the layer structure shown in FIG. 1A, change in the emission color was examined for different design conditions.

The first light-emitting unit 5a was a fluorescent light-emitting unit configured to cause fluorescence, and the second light-emitting unit 5b was a phosphorescent light-emitting unit configured to cause phosphorescence. Further, the first light-emitting layer 6a was a blue light-emitting layer, the second light-emitting layer 6b was a green light-emitting layer (non-blue light-emitting layer), the third light-emitting layer 6c was a red light-emitting layer (non-blue light-emitting layer), and the fourth light-emitting layer 6d was a green light-emitting layer (non-blue light-emitting layer). The light-emitting layers 6 of blue, green, and red included light-emitting dopants of blue, green, and red, respectively. Further, the second light-emitting layer 6b was thicker than the first light-emitting layer 6a, and the fourth light-emitting layer 6d was thicker than the third light-emitting layer 6c. The emission color was white. The aforementioned design was used as basic design, and three devices (elements) different in change in luminance and chromaticity were prepared based on this basic design, and properties of change in the chromaticity thereof were examined.

TABLE 1 shows the result. In TABLE 1, "ratio of Device LT70" means relative time at which luminance falls below 70%. The ratio of DeviceLT70 is represented as a relative value based on the relative time of device example A3, so that the ratio of Device LT70 of device example A3 is "1". 100% means that luminance equal to the initial luminance. Further, "LT100 CIE (x, y)" represents the x value and the y value of coordinates of chromaticity at the early stage, and "LT70 CIE (x, y)" represents the x value and the y value of coordinates of chromaticity at the time where the luminance falls below 70%. "Δx" and "Δy" represent amounts of change in the x value and the y value from the chromaticity coordinate point at the early stage to the chromaticity coordinate point at the time when the luminance falls below 70%, respectively. "ratio in initial luminance of A unit to B unit" represent a ratio in luminance of light emission of two units at the early stage of use, and "A unit" means a blue-based unit (first light-emitting unit) and "B unit" means a non-blue-based unit (second light-emitting unit). Further, "Du'v' (LT70)" represents an amount of change in the chromaticity based on change in the x value and the y value of the chromaticity coordinate point at the time when luminance falls below 70%. This amount of change in the chromaticity is an amount of change from the initial chromaticity. Note that, as "Du'v'" is smaller, it is made more difficult to perceive change in the chromaticity.

As shown in TABLE 1, an element showing small change in the chromaticity with time was designed as device example A3. In this case, the ratio of Device LT70 (relative time at which luminance falls below 70%) is smaller than those of other devices, and it is confirmed that luminance is not kept for a long term. Further, the x value and the y value change in a minus direction.

With regard to device example A2, change in the chromaticity can be observed in numerical values. However, Du'v' is 0.008, and hence it is made difficult for human's visibility to perceive change in color. Additionally, device example A2 can be 1.2 times longer in time necessary for decreasing of luminance than device example A3.

With regard to device example A1, change in the chromaticity can be observed in numerical values. However, Du'v' is 0.007, and hence it is made difficult for human's visibility to perceive change in color, and it can be determined that there is no change in the chromaticity in actual use. Additionally, device example A1 can be 1.7 times longer in time necessary for decreasing of luminance than device example A3. Further, device example A1 satisfies the relation of Δy>Δx, and is a device which makes it more difficult to perceive change in the chromaticity and has long lifetime.

TABLE 1

| Examples of Device | Ratio of Device LT70 | LT100 CIE(x, y) | LT70 CIE(x, y) | Δx | Δy | Ratio in Initial Luminance of A unit to B unit | Du'v' (LT70) |
|---|---|---|---|---|---|---|---|
| Device A1 | 1.7 | 0.388, 0.385 | 0.397, 0.400 | 0.009 | 0.015 | 1:3.16 | 0.007 |
| Device A2 | 1.2 | 0.389, 0.384 | 0.402, 0.390 | 0.013 | 0.006 | 1:3.24 | 0.008 |
| Device A3 | 1 | 0.385, 0.386 | 0.384, 0.385 | −0.001 | −0.001 | 1:3.11 | 0.001 |

Test Example 2

With regard to the organic EL element with the multi-unit structure defined by the layer structure shown in FIG. 1A, change in the emission color was examined for different design conditions.

use. Additionally, device example B1 can be 1.9 times longer in time necessary for decreasing of luminance than device example B3. Further, device example B1 satisfies the relation of $\Delta y > \Delta x$, and is a device which makes it more difficult to perceive change in the chromaticity and has long lifetime.

TABLE 2

| Examples of Device | Ratio of Device LT70 | LT100 CIE(x, y) | LT70 CIE(x, y) | $\Delta x$ | $\Delta y$ | Ratio in Initial Luminance of A unit to B unit | Du'v' (LT70) |
|---|---|---|---|---|---|---|---|
| Device B1 | 1.9 | 0.447, 0.410 | 0.448, 0.417 | 0.001 | 0.007 | 1:0.95 | 0.004 |
| Device B2 | 1.3 | 0.456, 0.414 | 0.467, 0.414 | 0.011 | 0.000 | 1:1.05 | 0.007 |
| Device B3 | 1 | 0.455. 0.414 | 0.453, 0.413 | −0.002 | −0.001 | 1:1.05 | 0.002 |

Each of the first light-emitting unit 5a and the second light-emitting unit 5b was a phosphorescent light-emitting unit configured to cause phosphorescence. Further, the first light-emitting layer 6a was a red light-emitting layer (non-blue light-emitting layer), the second light-emitting layer 6b was a green light-emitting layer (non-blue light-emitting layer), the third light-emitting layer 6c was a red light-emitting layer (non-blue light-emitting layer), and the fourth light-emitting layer 6d was a blue light-emitting layer. The light-emitting layers 6 of blue, green, and red included light-emitting dopants of blue, green, and red, respectively. Further, the second light-emitting layer 6b was thicker than the first light-emitting layer 6a, and the fourth light-emitting layer 6d was thicker than the third light-emitting layer 6c. The emission color was white. The aforementioned design was used as basic design, and three devices (elements) different in change in luminance and chromaticity were prepared based on this basic design, and properties of change in the chromaticity thereof were examined.

TABLE 2 shows the result. In TABLE 2. "ratio of Device LT70", "LT100 CIE (x, y)", "LT70 CIE (x, y)", "$\Delta x$", "$\Delta y$", "ratio in initial luminance of A unit to B unit", and "Du'v' (LT70)" have the same meanings as those in TABLE 1. However, in this device, "A unit" which is a blue-based unit is the second light-emitting unit, and "B unit" which is a non-blue-based unit is the first light-emitting unit. Further, "ratio of Device LT70" is represented as a relative value based on the relative time of device example B3, so that the ratio of Device LT70 of device example B3 is "1".

As shown in TABLE 2, an element showing small change in the chromaticity with time was designed as device example B3. In this case, the ratio of DeviceLT70 (relative time at which luminance falls below 70%) is smaller than those of other devices, and it is confirmed that luminance is not kept for a long term. Further, the x value and the y value change in a minus direction.

With regard to device example B2, change in the chromaticity can be observed in numerical values. However, Du'v' is 0.007, and hence it is made difficult for human's visibility to perceive change in color. Additionally, device example B2 can be 1.3 times longer in time necessary for decreasing of luminance than device example B3.

With regard to device example B1, change in the chromaticity can be observed in numerical values. However, Du'v' is 0.004, and hence it is made difficult for human's visibility to perceive change in color, and it can be determined that there is no change in the chromaticity in actual

REFERENCE SIGNS LIST

1 Organic Layer
2 Anode
3 Cathode
4 Substrate
5 Light emitting unit
6 Light emitting layer
7 Hole transport layer
8 Electron transport layer
9 Interlayer

The invention claimed is:

1. An organic electroluminescence element comprising:
a pair of electrodes including an anode and a cathode; and
an organic layer including multiple light-emitting layers,
the multiple light-emitting layers including a blue light-emitting layer including a blue light-emitting dopant,
wherein, when an emission color of the organic electroluminescence element operated at an operation temperature for a stable state is represented in a CIE1931 chromaticity coordinate system, a coordinate point A of the emission color at an early stage of use is represented by $(x_1, y_1)$, and a coordinate point B of the emission color deteriorated by use is represented by $(x_2, y_2)$, the organic electroluminescence element satisfying a relation of $y_2 \geq y_1$;
when amounts of changes in an x value and a y value from the coordinate point A to the coordinate point B are represented by equations of $\Delta x = x_2 - x_1$ and $\Delta y = y_2 - y_1$ respectively, the organic electroluminescence element satisfying a relation of $\Delta y \geq \Delta x$;
both the coordinate point A and the coordinate point B being within one MacAdam ellipse;
the organic electroluminescence element comprising a multi-unit structure in which the multiple light-emitting layers are distributed to multiple light-emitting units;
the multi-unit structure comprising a structure in which the multiple light-emitting units are stacked between the pair of electrodes;
the multiple light-emitting units including a blue-based light-emitting unit including the blue light-emitting layer and a non-blue-based light-emitting unit not including the blue light-emitting layer;
the blue-based light-emitting unit being a fluorescent light-emitting unit configured to cause fluorescence;
the non-blue-based light-emitting unit being a phosphorescent light-emitting unit configured to cause phosphorescence;

the non-blue-based light-emitting unit including a red light-emitting layer and a green light-emitting layer which is adjacent to the red light-emitting layer, and the green light-emitting layer is closer to the cathode than the red light-emitting layer; and when the emission color of the organic electroluminescence element operated at the operation temperature for the stable state is represented in the CIE1931 chromaticity coordinate system, the organic electroluminescence element showing at least one of: a chromaticity change of the blue-based light-emitting unit in which an x value of the emission color deteriorated by use is greater than an x value of the emission color at the early stage of use; and a chromaticity change of the non-blue-based light-emitting unit in which a y value of the emission color deteriorated by use is greater than a y value of the emission color at the early stage of use.

2. The organic electroluminescence element according to claim 1, wherein
the coordinate point A and the coordinate point B satisfy a relation of $x_2 \geq x_1$.

3. The organic electroluminescence element according to claim 1, wherein:
when the emission color of the organic electroluminescence element operated at the operation temperature for the stable state is represented in the CIE1931 chromaticity coordinate system, a maximum color changing light-emitting unit is defined as the longest one, in a moving distance from the coordinate point of the emission color at the early stage of use to the coordinate point of the emission color deteriorated by use, of the multiple light-emitting layers, the coordinate point of the emission color of the maximum color changing light-emitting unit at the early stage of use is defined as a coordinate point $A_1$, the coordinate point of the emission color of the maximum color changing light-emitting unit deteriorated by use is defined as a coordinate point $B_1$, and an x value and a y value of the coordinate point $A_l$ are respectively smaller than an x value(s) and a y value(s) of a coordinate point(s) of the emission color(s) of the other(s) of the multiple light-emitting layers at the early stage of use.

4. The organic electroluminescence element according to claim 3, wherein
the maximum color changing light-emitting unit includes the blue light-emitting layer.

5. The organic electroluminescence element according to claim 1, wherein
a light-emitting layer which has the largest y value in the CIE1931 chromaticity coordinate system of the multiple light-emitting layers is larger in thickness than the other(s) of the multiple light-emitting layers.

6. The organic electroluminescence element according to claim 1, wherein
a light-emitting layer which has the largest y value in the CIE1931 chromaticity coordinate system of the multiple light-emitting layers is in contact with another of the multiple light-emitting layers at one of opposite layer interfaces and is not in contact with another of the multiple light-emitting layers at the other of the opposite layer interfaces.

7. The organic electroluminescence element according to claim 1 having white emission color.

8. A lighting device comprising the organic electroluminescence element according to claim 1.

9. The organic electroluminescence element according to claim 1, wherein at least one of the pair of electrodes extends within a plane, and the multiple light emitting units are stacked in a direction transverse to the plane.

10. The organic electroluminescence element according to claim 1, further comprising an interlayer positioned between a first light emitting unit and a second light emitting unit of the multi unit structure.

11. The organic electroluminescence element according to claim 1, wherein a first light emitting unit of the multi unit structure and a second light emitting unit of the multi unit structure are positioned in overlying relation to each other between the pair of electrodes.

12. The organic electroluminescence element according to claim 1, wherein
the blue-based light-emitting unit includes a green light-emitting layer which is adjacent to the blue light-emitting layer and is closer to the cathode than the blue light-emitting layer.

13. The organic electroluminescence element according to claim 1, wherein a thickness of the green light emitting layer of the non-blue-based light emitting unit is larger than a thickness of the red light emitting layer of the non-blue-based light emitting unit.

14. The organic electroluminescence element according to claim 12, wherein a thickness of the green light emitting layer of the blue-based light emitting unit is larger than a thickness of the blue light emitting layer of the blue-based light emitting unit.

* * * * *